US012640536B2

(12) United States Patent
Aowudomsuk et al.

(10) Patent No.: US 12,640,536 B2
(45) Date of Patent: May 26, 2026

(54) HOUSING, OPTIONALLY A TRANSISTOR OUTLINE HOUSING, SOCKET FOR HOUSING, AND ASSEMBLY INCLUDING SUCH A HOUSING AND/OR SOCKET

(71) Applicant: Schott AG, Mainz (DE)

(72) Inventors: Artit Aowudomsuk, Bangkok (TH); Reinhard Ecker, Landshut (DE)

(73) Assignee: SCHOTT AG, Mainz (DE)

( * ) Notice: Subject to any disclaimer, the term of this patent is extended or adjusted under 35 U.S.C. 154(b) by 721 days.

(21) Appl. No.: 18/099,336

(22) Filed: Jan. 20, 2023

(65) Prior Publication Data

US 2023/0155345 A1 May 18, 2023

Related U.S. Application Data

(63) Continuation of application No. PCT/EP2021/071112, filed on Jul. 28, 2021.

(30) Foreign Application Priority Data

Jul. 30, 2020 (DE) ..................... 10 2020 120 167.2

(51) Int. Cl.
*H01S 3/04* (2006.01)
*H01S 5/02212* (2021.01)
(Continued)

(52) U.S. Cl.
CPC .......... *H01S 5/02212* (2013.01); *H01S 5/023* (2021.01); *H01S 5/02415* (2013.01)

(58) Field of Classification Search
CPC .. H01S 5/02212; H01S 5/023; H01S 5/02415; H01S 5/02325; H01S 5/02345; H01S 5/06804; H01S 5/0231
See application file for complete search history.

(56) References Cited

U.S. PATENT DOCUMENTS 4,924,471 A * 5/1990 Clark ................... H01S 5/02415
372/43.01
5,197,076 A 3/1993 Davis et al.
(Continued)

FOREIGN PATENT DOCUMENTS

| DE | 199 26 801 C2 | 5/2001 |
| DE | 10 2017 120 216 A1 | 3/2019 |
| WO | 2019/161755 A1 | 8/2019 |

OTHER PUBLICATIONS

"Center-Hole Thermoelectric Coolers", TEC Microsystems, retrieved from the Internet: URL:https://www.tec-microsystems.com/products/thermoelectric-coolers/center-hole-thermoelectric-coolers.html, Apr. 18, 2018 (3 pages).

(Continued)

*Primary Examiner* — Kinam Park
(74) *Attorney, Agent, or Firm* — TAYLOR & EDELSTEIN, PC

(57) ABSTRACT

A socket for an electronic component includes: an electrically insulating material; a base body including at least one opening configured for accommodating an electrically conductive pin configured for being electrically connected to the electronic component, the at least one opening being sealed with the electrically insulating material such that the electrically conductive pin is fed through the at least one opening while being electrically insulated from the base body; and a shell part including a pedestal configured for accommodating the electronic component, at least the shell part of the socket including a metal with a thermal conductivity of at least 100 W/mK.

19 Claims, 7 Drawing Sheets

(51) Int. Cl.
  *H01S 5/023*   (2021.01)
  *H01S 5/024*   (2006.01)

(56) References Cited

U.S. PATENT DOCUMENTS

| | | | |
|---|---|---|---|
| 5,578,863 A | 11/1996 | De Poorter | |
| 6,995,931 B2 | 2/2006 | Hwang et al. | |
| 10,177,529 B2 | 1/2019 | Hirayama | |
| 11,362,476 B2* | 6/2022 | Cheng | H01S 5/02423 |
| 2002/0018500 A1* | 2/2002 | Aikiyo | H01S 5/02212 |
| | | | 372/36 |
| 2003/0210719 A1* | 11/2003 | Yamamoto | H01S 5/02212 |
| | | | 372/36 |
| 2005/0130342 A1* | 6/2005 | Zheng | H10F 77/407 |
| | | | 257/E31.118 |
| 2006/0239316 A1 | 10/2006 | Kim et al. | |
| 2011/0096543 A1 | 4/2011 | Yabe et al. | |
| 2012/0206046 A1 | 8/2012 | Huang et al. | |
| 2013/0250520 A1 | 9/2013 | Taniguchi | |
| 2015/0085197 A1 | 3/2015 | Yoshida | |
| 2015/0103856 A1* | 4/2015 | Hagino | H01S 5/4025 |
| | | | 372/44.01 |
| 2017/0310078 A1* | 10/2017 | Hirayama | H01S 5/02345 |
| 2018/0284374 A1 | 10/2018 | Wang | |
| 2018/0310397 A1 | 10/2018 | Noguchi et al. | |
| 2021/0083445 A1* | 3/2021 | Cheng | H01S 3/025 |
| 2022/0069540 A1* | 3/2022 | Wai Li | H01L 23/045 |

OTHER PUBLICATIONS

German Office Action dated Jan. 28, 2021 for German Patent Application No. 10 2020 120 167.2 (16 pages).
Notification of Transmittal of the International Search Report and the Written Opinion of the International Searching Authority, or the Declaration dated Oct. 27, 2021 for International Application No. PCT/EP2021/071112 (17 pages).

* cited by examiner

HOUSING, OPTIONALLY A TRANSISTOR OUTLINE HOUSING, SOCKET FOR HOUSING, AND ASSEMBLY INCLUDING SUCH A HOUSING AND/OR SOCKET

CROSS REFERENCE TO RELATED APPLICATIONS

This is a continuation of PCT application no. PCT/EP2021/071112, entitled "HOUSING, PREFERABLY A TRANSISTOR OUTLINE HOUSING, SOCKET FOR HOUSING, AND ASSEMBLY COMPRISING SUCH A HOUSING AND/OR SOCKET", filed Jul. 28, 2021, which is incorporated herein by reference. PCT application no. PCT/EP2021/071112 claims priority to German patent application no. DE 10 2020 120 167.2, filed Jul. 30, 2020, which is incorporated herein by reference.

BACKGROUND OF THE INVENTION

1. Field of the Invention

The present invention relates to a housing for an electronic component. In particular, the invention relates to a TO (transistor outline) housing which may be used in electro-optical applications, for example, in high-frequency data transmission. Further, the invention relates to a socket for a TO housing, as well as to an assembly including such a housing and a thermoelectric cooler.

2. Description of the Related Art

DE 10 2017 120 216 A1, WO 2019/161755 A1, US 2018/0284374 A1 and U.S. Pat. No. 10,177,529 B2 each relate to housings for optoelectronic components suited for electro-optical applications, such as, for example, data transmission at high transmission rates.

For some opto-electronic applications, in particular, for high-frequency data transmission and long haul transmission, a precise control of laser wavelength is mandatory. However, the wavelength of a laser is temperature dependent. It is therefore necessary to control the temperature of a laser, such as a laser diode for example, so that the laser wavelength only varies within a predetermined, narrow range.

In general, a thermal electric cooler is used to control laser temperature for at least one of the following reasons:

controlling the laser wavelength for WDM (wavelength-division multiplexing) applications;

increasing the connection range by maintaining laser wavelength at extreme environment temperature at minimum chromatic dispersion target wavelength of fiber optic cable;

maintaining a suitable laser power efficiency and speed;

avoiding the risk of laser reliability failure due to breakage of the bonding at elevated temperatures and/or mode hopping at low temperatures.

To this end, a housing, such as a TO housing, may also include a thermoelectric cooler. According to a common design of cooled housings, for example, including a laser diode as electronic component, the thermal electric cooler is arranged inside the housing, with the laser diode attached directly onto it. In this way, cooling is provided directly to the heat source itself, that is, the laser diode in this case.

However, package size and other components limit the size of the thermal electric cooler, which results in a limited cooling capacity.

Therefore, there is a need for housings, such as, for example, TO housings, with improved cooling capacity, yet a small overall size.

What is needed in the art is a housing for an electronic component, optionally a TO housing, with increased cooling capacity compared to the housings of the state of the art, while at the same time ensuring a small overall housing size.

SUMMARY OF THE INVENTION

The present invention relates to a housing for an electronic component. In particular, the invention relates to a TO (transistor outline) housing which may be used in electro-optical applications, for example, in high-frequency data transmission. Suitable electronic components may include optoelectronic components. Suitable components in such applications may be laser diodes (LD), such as electro-absorption modulated laser diodes (EML), distributed feedback laser (DFB), Fabry-perot laser (FP), optical modulators, photodiodes (PD) and other electronic components used for optical communication. Data transmission rates may be as high as 50 GBit/s or higher. Further, the invention relates to a socket for a TO housing, as well as to an assembly including such a housing and a thermoelectric cooler.

The present invention relates to a socket for an electronic component, such as laser diodes (LD), like electro-absorption modulated laser diodes (EML), distributed feedback laser (DFB), Fabry-perot laser (FP), optical modulators, photodiodes (PD) and other electronic components, especially components used for optical communication, in particular such components that are suited for high frequency data transmission with high transmission rates up to 50 GBit/s or even more. However, in general, the socket or housing may be any suitable electronic component, and the disclosure is not limited to the electronic components explicitly mentioned in the present disclosure. The socket includes a base body including at least one opening for accommodating an electrically conductive pin that is suited to be electrically connected to the electronic component, wherein the at least one opening is sealed with an electrically insulating material, so that the electrically conductive pin is fed through the opening while being electrically insulated from the base body, and a shell part including a pedestal for accommodating an electrical component that may optionally be arranged on a submount, wherein at least the shell part of the socket includes a metal with a thermal conductivity of more than 100 W/mK, optionally more than 200 W/mK. Optionally, the socket includes an electronic component and the pin is soldered to the electronic component directly.

In the scope of the disclosure, the socket therefore is configured as a two-part component, that is, including two separate parts, wherein the base body is the central part of the socket that includes the opening or openings, and the shell part arranged at least partially at the perimeter of the base body, thereby surrounding the base body at least partially. Further, the shell part may be configured so that it has a higher thermal conductivity compared to the base body, as at least the shell part includes a metal with a high thermal conductivity, that is a thermal conductivity of more than 100 W/mK, optionally more than 200 W/mK.

In the scope of the present disclosure, metal is to be understood to refer to a material with metallic bonding. Therefore, the term metal refers not only to metallic elements, but to alloys as well. In the scope of the present disclosure, therefore, the shell part may, for example include a metal with high thermal conductivity, for example, copper, or may consist of a metal with high thermal conductivity, such as copper, or may for example include or consist of an alloy with high thermal conductivity, for example, a suitable copper alloy.

In the scope of the present disclosure, when reference is made to a component including a certain material, this is understood to mean, in particular, that the component may also consist predominantly, meaning more than 50 wt.-%, or essentially, meaning more than 90 wt.-%, or completely of said material. Therefore, according to the disclosure, the shell part may consist predominantly or essentially or even totally of a metal. In particular, the shell part may consist predominantly or essentially or even totally of a metal alloy.

Such a design of a socket offers several advantages.

The socket according to the disclosure may be attached to a thermoelectric cooler (TEC), for example, by arranging the socket and/or the housing including the socket at least partially on a thermoelectric cooler.

As the shell part of the socket includes a metal with a thermal conductivity of at least 100 W/mK, optionally more than 200 W/mK, such as, for example, copper, the submount and/or the electric component need not be attached to the thermoelectric cooler directly. Rather, it has been found that cooling efficiency is comparable to that achieved for standard cooled housings wherein the electronic component, for example, a laser diode, is attached directly to an internal thermoelectric cooler that is arranged within the housing.

However, as the TEC is no longer a component of the housing, the size of the thermoelectric cooler may increase, thereby providing for a higher cooling capacity which is needed for high power devices like laser diodes.

Further, without increasing the size of the housing, there is more excess space to accommodate further components that may be arranged inside the housing.

In cooled housings according to the disclosure, the pedestal height may be chosen to match the height of the electronic component, such as a laser diode, for example, in order to minimize signal losses by:

a short length of the pin; and/or direct soldering of the pin to the electronic component.

Further, in housings of the state of the art that include an internal TEC, wire bonds are used to connect the pin to the electronic component, as the height of the pedestal has to be chosen taking into account the cooler height, and direct soldering of electronic component and pin is not possible. However, such wires cause high signal losses, that is, the wire bond or bonds between an RF submount to a laser submount usually result(s) in degradation of the RF signal integrity.

According to the disclosure, an RF pin may be soldered to a submount, such as a laser submount, directly.

According to the disclosure, pedestal height may be much shorter in comparison to housings of the state of the art, as the height of an internal TEC no longer has to be provided for. This allows to further minimize signal losses. In standard housing with integrated TEC, the TEC thickness adds to a higher laser position by at least 0.9 mm because the laser submount is on a carrier, such as a metal carrier, for example, which is placed on the TEC, too.

Furthermore, the short pedestal may be formed in a deep-draw process, that is, in a cheap and effective method, thereby enabling a more economic manufacture of the housing.

According to an embodiment of the present invention, the metal includes at least one of Cu, Ag, Au, Mo, W or Al, or any combination thereof. These metals are metals with a high thermal conductivity. Al may be an optional metal, as it is readily available. However, for high cooling efficiency, it may be optional to use a metal with a higher thermal conductivity. Therefore, copper is optional. In particular, the metal may be a metal alloy including at least one of Cu, Ag, Au, Mo, W or Al, or any combination thereof, provided that the metal alloy has a high thermal conductivity.

According to an embodiment of the present invention, the pedestal includes the metal with a thermal conductivity of at least 100 W/mK, optionally more than 200 W/mK, wherein optionally the shell part is brazed to the base body. Particularly, the base body may include or consist of a metal or metal alloy different from the metal or metal alloy of the shell part. In particular, the base body may include or even consist of a metal from the group of steels, such as standard steels, stainless steels, rustproof steels, and high-temperature stable ferritic steels, which are also known under the brand name Thermax, for example Thermax 4016, Thermax 4742, or Thermax 4762, or Crofer 22 APU or CroFer 22 H, or NiFe-/NiFeCo based materials, e.g. NiFe45, NiFe47, or metals or metal alloys known under the brand name Inconel, for example Inconel 718 or X-750, or steels such as known under the designations CF25, Alloy 600, Alloy 625, Alloy 690, SUS310S, SUS430, SUH446, or SUS316, or austenitic steels such as 1.4828 or 1.4841. Such an embodiment is advantageous, as standard feedthroughs (for example, feedthroughs may also be referred to as glass-to-metal-seals, GTMS) that are readily available in standard production processes may be used for the base body. For example, if a GTMS is used as feedthrough, the GTMS may be a compression seal or match seal. Such an embodiment may further be advantageous as it allows for using a glass with low dielectric constant to seal the pin. Eventually, the GMTS part may be brazed to the shell part by using a braze material system, for example, by using a gold-tin braze or a copper-silver braze. However, in general, it is possible to use any kind of feedthrough, for example, a ceramic feedthrough in box packaging.

Alternatively, according to a further embodiment, the shell part and the base body both include the metal with a thermal conductivity of at least 100 W/mK, optionally more than 200 W/mK. Such an embodiment allows for very efficient, rapid cooling and may therefore be optional for high power applications. It is to be noted that in that case, a sealing material, for example a glass, has to be used that matches the coefficient of thermal expansion of copper in order to provide for a tight, optionally even hermetic sealing.

According to an embodiment of the present invention, the electrically insulating material includes a glass or glass ceramic. Glass and glass ceramic materials are materials commonly used in electrical feedthroughs and allow for a very effective, optionally even hermetic sealing. Further, they offer a high chemical and mechanical stability, especially when compared to polymer seals. In comparison with ceramic materials, glasses and glass ceramics usually offer a better wetting of the surface of the bonding partners to be sealed, that is, the pin and the base body in this case.

According to an embodiment of the present invention, the pin is soldered to the electronic component directly. By doing this, no wire bonds to connect the pin and the component are necessary. This allows for minimizing of signal losses. Long bond wires, as required in standard housing including a TEC arranged within the housing, are problematic in view of RF properties. However, in standard housing with such an internal TEC, due to substrate movement because of thermal expansion, no direct solder connection between pin and electronic component is possible, but a wire connection is needed instead.

According to an embodiment of the present invention, the socket has a circular shape, when viewed in a top view.

According to a further embodiment of the present invention, the shell part of the socket includes a ring, wherein the ring is suited for fixing a cap to the socket in a sealed manner. Optionally, the cap may be fixed to the socket in a hermetically sealed manner, which may optionally be achieved by fusing, soldering and/or brazing. The ring may be a separate part attached to the shell part. Further, the ring may include a metal different from the metal of the shell part. This can be advantageous to facilitate fixing of the cap.

According to a further embodiment of the present invention, the shell part laterally extends over the base body, thereby forming a flange, or collar part. Such an embodiment may be particularly advantageous, as it allows to fix a bottom part of the shell part to the cold plate of a thermoelectric cooler. In that case, optionally the cooler includes an opening, wherein the shape of the opening particularly optionally corresponds to that of the socket and/or the shape of the base body. That is, if the socket and/or the base body have, in a top view, a circular shape, the opening optionally likewise has a circular shape. However, it may be advantageous if the lateral dimensions, for example, the diameter in case of a circularly shaped opening and base body, of the opening will be slightly larger than that of the base body, thereby forming a gap at least between the hot plate and that part of socket and/or base body arranged within the opening, in order to thermally uncouple socket and at least the hot plate of the cooler.

According to a further embodiment of the present invention, the pedestal has a side portion. In the sense of the disclosure, the side portion of the pedestal is understood as that side of the pedestal that faces towards a central portion (or the centre) of the socket. The electronic component and/or the submount are arranged on said side portion of the pedestal. In that way, a pin, optionally an RF pin, may be connected to the electronic component directly in a very easy and quick manner.

Optionally, the pedestal has a height of at least 1.0 mm and at most 3.0 mm. This allows for a compact size of the socket and, thus, the housing.

A second aspect of the present disclosure relates to a transistor outline (TO) housing. The transistor outline housing according to the disclosure includes a socket suited to accommodate an electronic component, such as, for example, a photodiode, or a laser diode. The socket includes a base body and a shell part. The base body includes at least one opening for accommodating an electrically conductive pin. However, it is understood that usually the base body will include several openings for several pins that may be used to contact different components. The opening or the openings usually will be sealed with an electrically insulating material so that the pin or pins will be electrically insulated from the base body. The shell part of the socket includes a pedestal for accommodating an electrical component, wherein the electrical component may be arranged on a submount. At least the shell part of the socket includes a metal with a thermal conductivity of at least 100 W/mK, optionally more than 200 W/mK.

In particular, the housing according to the disclosure may include a socket according to embodiments of the disclosure.

Further, the housing includes a cap that may be fixed to the socket in order to seal the electronic component and/or further components arranged within the housing. Optionally, the housing is sealed hermetically in order to avoid corrosion of components. That cap may further include an opening in which an optical element, for example, a lens, may be arranged, so that light emitted by an electronic component, such as a laser diode, may be injected into a light guide element, such as an optical fibre or a bundle of optical fibres.

According to an embodiment of the present invention, no thermoelectric cooler is arranged within the housing. In that way, the pedestal height and, thus, the socket height as well as the overall housing height will be kept low in comparison to standard cooled housings. A short pedestal height is advantageous as in this way, signal losses may be minimized in a quick and easy manner, for example, by direct soldering of the pin to the electronic component and a short length of the pin, in particular on the shell part side of the socket. Further, as an external component a larger thermoelectric cooler with a higher cooling power may be employed although the housing is of a compact size.

According to an embodiment of the present invention, the height of the housing is less than 6.0 mm wherein optionally the height of the housing is at least 2.0 mm. In other words, the housing or package size is kept small. An efficient cooling of this housing may be provided for by assembling the housing according to embodiments of the disclosure and a thermoelectric cooler.

Therefore, a further aspect of the disclosure relates to an assembly including a housing for an electronic component and a thermoelectric cooler, optionally a transistor outline housing according to embodiments of the disclosure, optionally a transistor outline housing including a socket according to embodiments of the present disclosure, and a thermoelectric cooler. The housing includes a socket that includes a base body and a shell part, wherein the housing is attached to the thermoelectric cooler so that at least a bottom region and/or a side region of the shell part of the socket is attached to a cold end side of the thermoelectric cooler. The assembly may further include a flex board that may be arranged on a bottom side of the base body, that is, that side of the base body facing away from the cap.

In that way, by attaching the shell part of the socket, that is, that part of the socket that includes a metal with high thermal conductivity, at least partially to a cold end side of a TEC, cooling of the housing and thus, the electronic component arranged within the housing, is achieved. Further, the size of the thermoelectric cooler is not limited by the housing size. Therefore, in order to ensure efficient cooling, it may be contemplated to increase the size of the thermoelectric cooler, while at the same time a small housing size is maintained.

According to an embodiment of the present invention, the thermoelectric cooler includes an opening suited for accommodating the housing so that at least the base body of the socket may be arranged within the opening at least partially. It may be contemplated that the shell part of the socket has a lateral dimension that is larger than the lateral dimension of the base part of the socket, so that the shell part protrudes over the base part of the socket, thereby optionally forming a flange or collar part. Such a socket may be arranged in the opening of the thermoelectric cooler in such a way that at least a bottom region of the shell part, in particular, at least a bottom region of the flange or collar part, is attached to a top part of the cold end side of the TEC. In that way, a compact overall design of the assembly may be achieved.

Optionally, the opening of the thermoelectric cooler, in a top view, has a shape similar to the shape of the housing and/or the socket, optionally the same shape. That is, if the socket has a circular shape in a top view, the opening of the thermoelectric cooler will optionally have a round shape, too. However, it will be advantageous that the size of the opening will be slightly larger than that of the cross section of the base body of the socket.

According to a further embodiment of the present invention, a gap is formed at least between a side region of the hot plate of the thermoelectric cooler and the socket. In this way, at least the hot plate of the thermoelectric cooler and the socket are thermally uncoupled.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings, wherein.

Corresponding reference characters indicate corresponding parts throughout the several views. The exemplifications set out herein illustrate embodiments of the invention, and such exemplifications are not to be construed as limiting the scope of the invention in any manner.

DETAILED DESCRIPTION OF THE INVENTION

Figure 1:
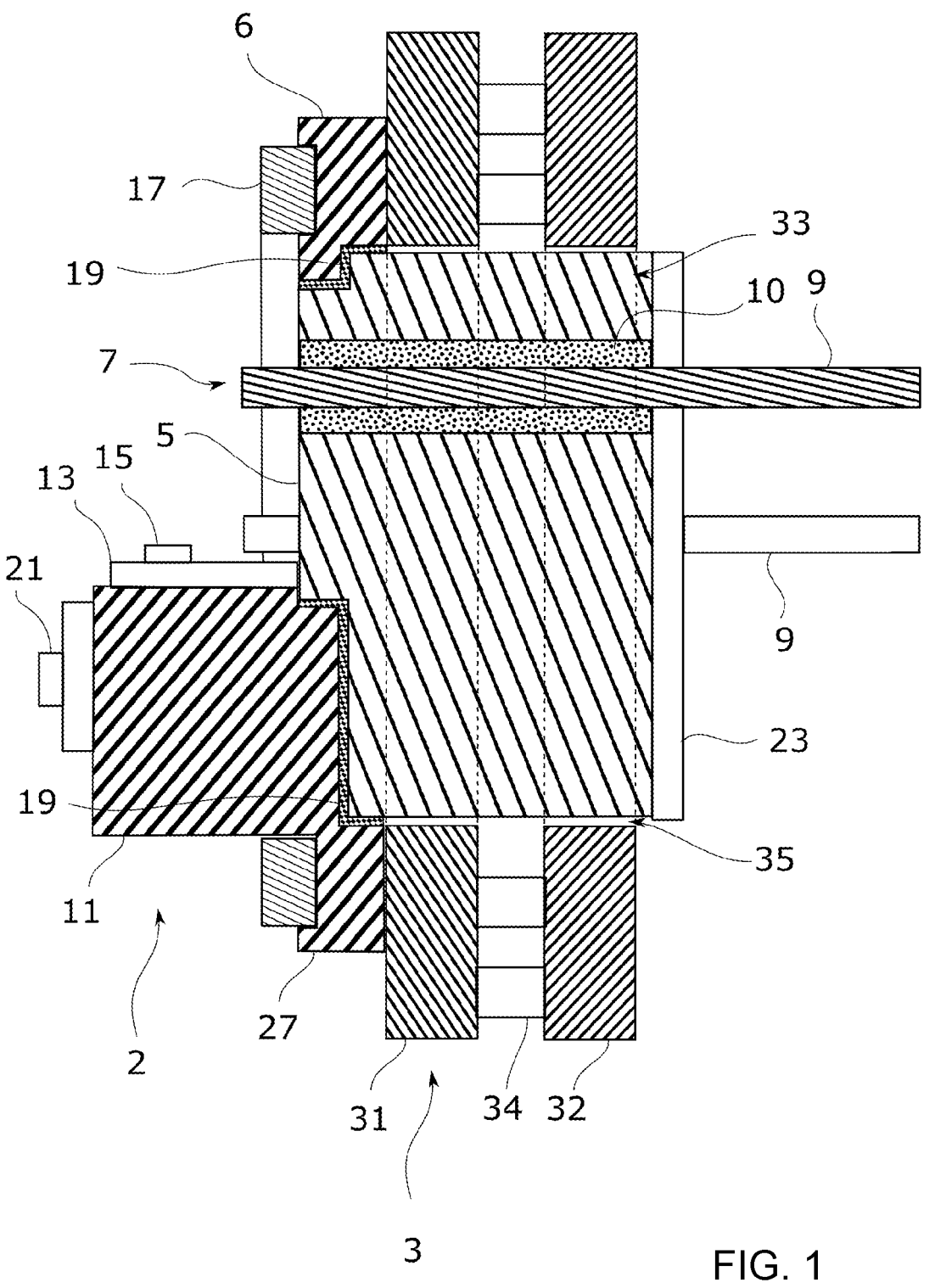
FIG. 1 is a sectional view of an assembly including a thermoelectric cooler and a housing including a socket, in accordance with an exemplary embodiment of the present invention.

The invention will now be further explained with reference to the following figures. In the figures, like reference numerals refer to like or corresponding elements.

FIG. 1 shows a sectional view of a first embodiment of an assembly of thermoelectric cooler 3 and housing 1 including a cap (not shown) and a socket 2. Thermoelectric cooler 3 includes opening 33 in which the base part 5 of socket 2 has been arranged at least partially. The base part 5 is formed so as to extend beyond both the cold plate 31 and the hot plate 32 of thermoelectric cooler 3, thereby protruding from both sides of opening 33. Base body 5 includes at least one opening 7 for accommodating electrically conductive pin 9. It is to be noted here that usually, base body 5 will include several openings 7 (not shown here) arranged in different sections or portions of base body 5 accommodating several pins 9, so as to contact different components arranged on socket 2. Opening 7 is sealed with an electrically insulating material 10, such as, for example, a glassy material. In general, also ceramic, glass ceramic, or polymeric materials may be used to seal opening 7. However, glass or glass ceramic materials may be optional, as these materials melt during the sealing process at least partially, thereby wetting both the pin and the side wall of opening 7 at least partially, which allows for an efficient bonding between the sealing material and the bonding partners. Bonding partners, are, in this respect, the base part 5 of socket 2 and the respective pin or pins 9. By using glass or glass ceramic as insulating material 10, the pin or pins may be fed through opening or openings 7 in an electrically insulated manner, while at the same time achieving a fluid-proof, optionally even hermetic, seal.

Socket 2 further includes shell part 6 that includes a metal with high thermal conductivity. In the scope of the present disclosure, a metal with a thermal conductivity of at least 100 W/mK, optionally more than 200 W/mK, is regarded as a metal with high thermal conductivity. Suitable examples include Al, W, Mo, Ag, Au, and Cu and alloys with at least one of these metals. Copper is optional. In an optional embodiment, shell part 6 is made of copper. Copper is a noble metal with very high thermal conductivity. However, shell part 6 may be formed of any suitable metal material or an alloy including a metal with high thermal conductivity.

It is noted that according to the assembly as shown in FIG. 1, shell part 6 and base body 5 may include different materials. That is, base body 5 may include or consist of a different metal than shell part 6. Base body 5 may for example include a standard feedthrough such as, for example, a glass-to-metal-seal as may be used in common housings according to the state of the art. Particularly, base body 5 may include or consist of a metal or metal alloy different from the metal or metal alloy of shell part 6. In particular, base body 5 may include or consist of a metal from the group of steels, such as standard steels, stainless steels, rustproof steels, and high-temperature stable ferritic steels, which are also known under the brand name Thermax, for example Thermax 4016, Thermax 4742, or Thermax 4762, or Crofer 22 APU or CroFer 22 H, or NiFe-/NiFeCo based materials, e.g. NiFe45, NiFe47, or metals or metal alloys known under the brand name Inconel, for example Inconel 718 or X-750, or steels such as known under the designations CF25, Alloy 600, Alloy 625, Alloy 690, SUS310S, SUS430, SUH446, or SUS316, or austenitic steels such as 1.4828 or 1.4841. In that case, as shown in FIG. 1, shell part 6 and base body 5 may be joined via braze connection 19. Any braze material may be used. However, AuSn- or AgCu-based materials may be optional.

However, in general, it is also possible that both shell part 6 and base body 5 include or consist of the same material, in this case, a metal with high thermal conductivity. In the latter case, no brazing is needed, and the use of the same metal material for both base body 5 and shell part 6 minimizes thermal stresses between base body 5 and shell part 6 due to a mismatch of thermal expansion coefficients, for example. However, in that case, no standard feedthrough, for example, a feedthrough also known as "glass-to-metal-seal," can be used. Rather, new sealing materials that match both the thermal expansion of the socket material and the pin material, need to be used.

Further, as can be seen from the depiction of FIG. 1, shell part 6 is arranged at a perimeter of base body 5 at least partially, and base body 5 is that part of socket 2 that includes the opening or openings 7. That is, base body 5 and shell part 6 are formed as separate parts.

Shell part 6 includes pedestal 11. Pedestal 11 is formed to accommodate electronic components, such as, for example, electronic component 15 that is, in this case, a laser diode. Here, electronic component 15 is mounted on submount 13, and submount 13 is attached to pedestal 11. Pedestal 11, as part of the shell part 6, is made of a material including a metal with high thermal conductivity. Shell part 6 is formed, in this case, to protrude over base body 5 of socket 2, thereby forming a flange. This allows to arrange a bottom part of shell part 6 on cold plate 31 of cooler 3. Cold plate 31 of thermoelectric cooler 3 is connected to hot plate 32 via semiconductor pillars 34, thereby allowing cooling of shell part 6 and, thus, pedestal 11 as well as electronic component 15 arranged on submount 13.

In order to thermally uncouple socket 2 and hot plate 32 of cooler 3, a gap 35 is formed at least between a side region of the base body arranged within the opening of cooler 3 and hot plate 32. Here, gap 35 is formed between the side region of base body 5 and both hot plate 32 and cold plate 31.

The assembly according to FIG. 1 further includes temperature sensor 21 arranged on pedestal 11 as well as flex board 23 arranged on a bottom side of base body 5. Here, bottom side refers to that side of the housing facing away from the cap. Furthermore, the shell part 6 includes ring 17 that may be used to fix the cap onto the socket in a hermetically sealed manner. Pins 9 are connected to flex board 23 arranged on a bottom side of base body 5 of socket 2.

Figure 2:
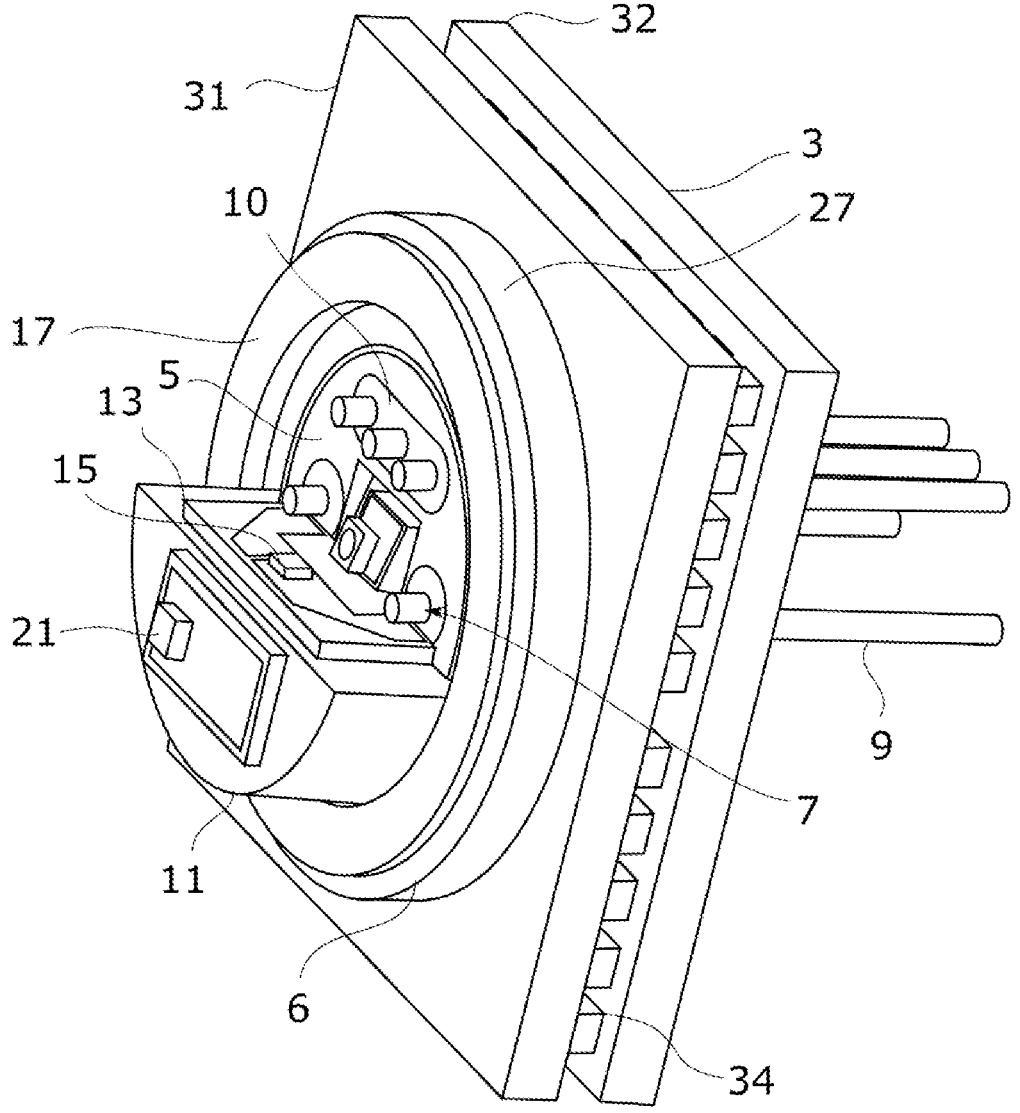
FIG. 2 is a perspective view of the housing, in accordance with an exemplary embodiment of the present invention.

FIG. 2 is a perspective view of housing 1 of FIG. 1. Socket 2 is arranged within a central opening of thermoelectric cooler 3 including cold plate 31 and hot plate 32 connected by semiconductor pillars 34. In this perspective view, it can be noticed that several pins 9 are fed through openings 7 of the base body 5 of socket 2 in an electrically insulated manner. This has been achieved by sealing them with an electrically insulating material 10.

The short pedestal 11, on the inward side of which submount 13 including electric component 13, for example a laser diode, such as an electro-absorption modulated laser or distributed feedback laser diode, is arranged, allows for electronic component 13 to be connected directly to a pin 9, for example via brazing. In this way, RF losses that may otherwise result due to conduction may be minimized. The inward side of pedestal 11 is that side of pedestal 11 that faces towards a central region (or the centre) of socket 2.

Figure 3:
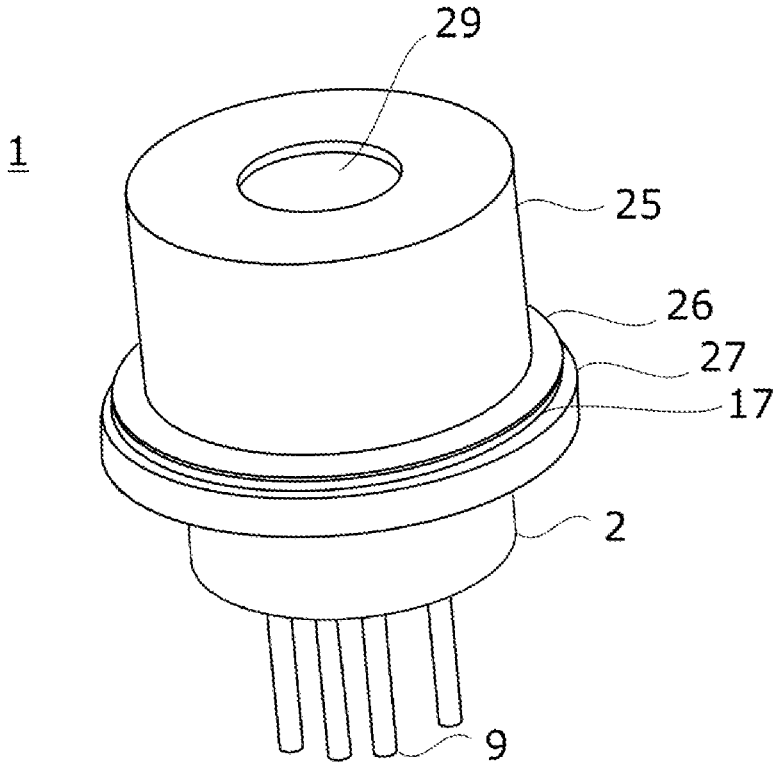
FIG. 3 is a perspective view of the housing, in accordance with an exemplary embodiment of the present invention.

FIG. 3 is a perspective view of housing 1, here shown with cap 25 fixed to socket 2 via ring 17. Cap 25 here includes window 29, in which an optical element, such as a lens, may be arranged. Several pins 9 protrude from the lower side of housing 1. The cap 25 includes a flange 26 which is fastened and sealed to ring 17.

In housing 1 as shown in FIGS. 1 to 3, the outer diameter of shell part 6 is greater than the outer diameter of base body 5 so that shell part 6 extends over base body 5, thereby forming flange (or collar) 27. This allows for arranging at least a part of the bottom side, that is, that side of shell part 6 facing away from cap 25, on cold plate 31 of thermoelectric cooler 3. In particular, at least a part of the bottom side of flange 27 (or the collar) is arranged on cold plate 31 at least partially. In order to connect pins 9 to flex board 23 as shown in the side view of FIG. 1, pins 9 may be slightly longer than pins in common housings of the state of the art to compensate for the height of cooler 3 in which socket 2 of housing 1 is arranged at least partially.

Figure 4:
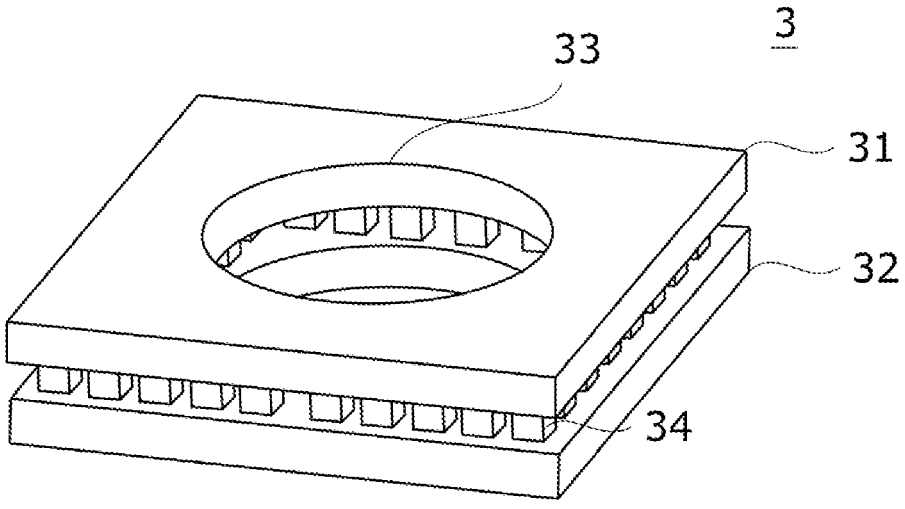
FIG. 4 is a perspective view of the thermoelectric cooler suited for accommodating the housing at least partially, in accordance with an exemplary embodiment of the present invention.

FIG. 4 depicts thermoelectric cooler 3 suited for accommodating a housing 1 according to embodiments at least partially. Cooler 3 includes cold plate 31 connected via semiconductor pillars 34 to hot plate 32. Cooler 3 includes, in this case, a central opening 33. The form of opening 33 optionally corresponds at least in principle to that of the base body 5 of socket 2, in order to allow for a compact design of the assembly. In FIG. 4, opening 33 has a circular shape that is best suited to accommodate a circularly shaped socket 2—or circularly shaped base body 5 of socket 2—at least partially. In order to enable thermally uncoupling that part of socket 2 arranged within the opening of cooler 3 and hot plate 32, the lateral dimension of the opening—here the diameter—will be slightly larger than that of the socket part, so that gap 35 may be formed at least between that part of the socket 2 arranged within opening 33 and hot plate 32. However, in general, opening 33 may have any other suitable shape, for example, a rectangular or elliptical or polygonal shape, when viewed in a top view. Further, it is understood that even if a circular shape of socket 2, shell part 6 and base body 5, when viewed in a top view, is optional, in general these elements may be of any shape and may, in particular, have a rectangular or elliptical or polygonal shape.

Figure 5:
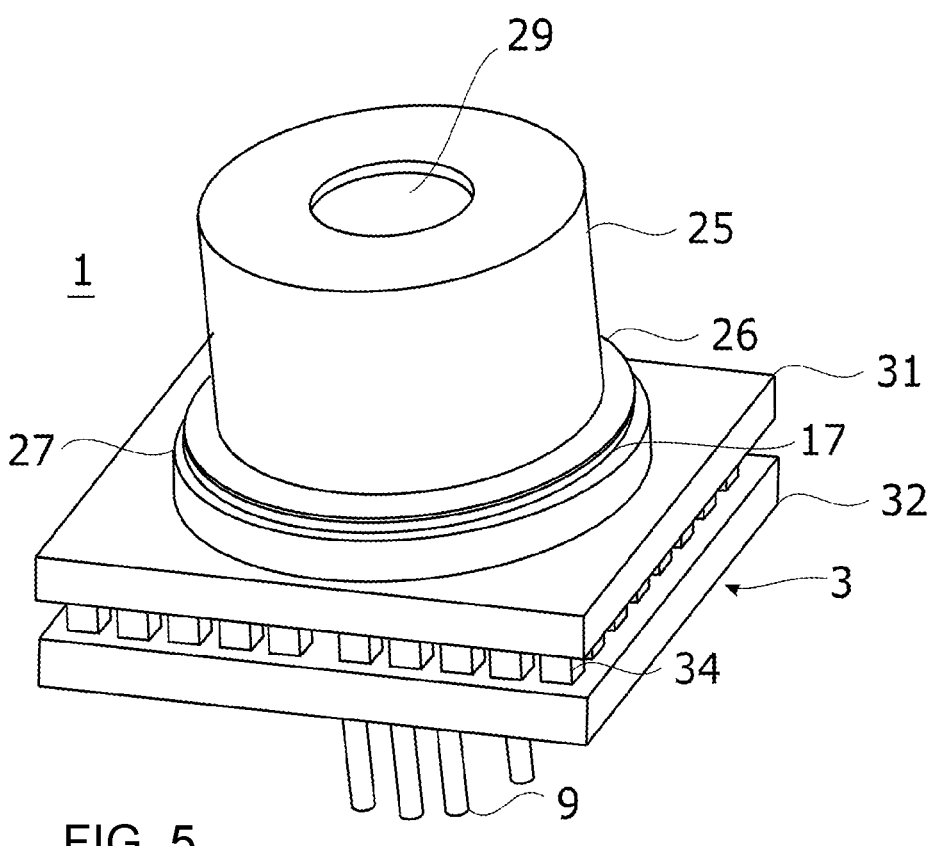
FIG. 5 is a perspective view of the housing including a cap, in accordance with an exemplary embodiment of the present invention.

FIG. 5 depicts, in a perspective side view, housing 1 including cap 25 with window 29 and socket 2 including ring 17 to seal the components arranged within housing 1, wherein housing 1 has been arranged partially in the opening of cooler 3 partially. Pins 9 protrude from opening 33 of cooler 3 and may be contacted electrically.

Figure 6:
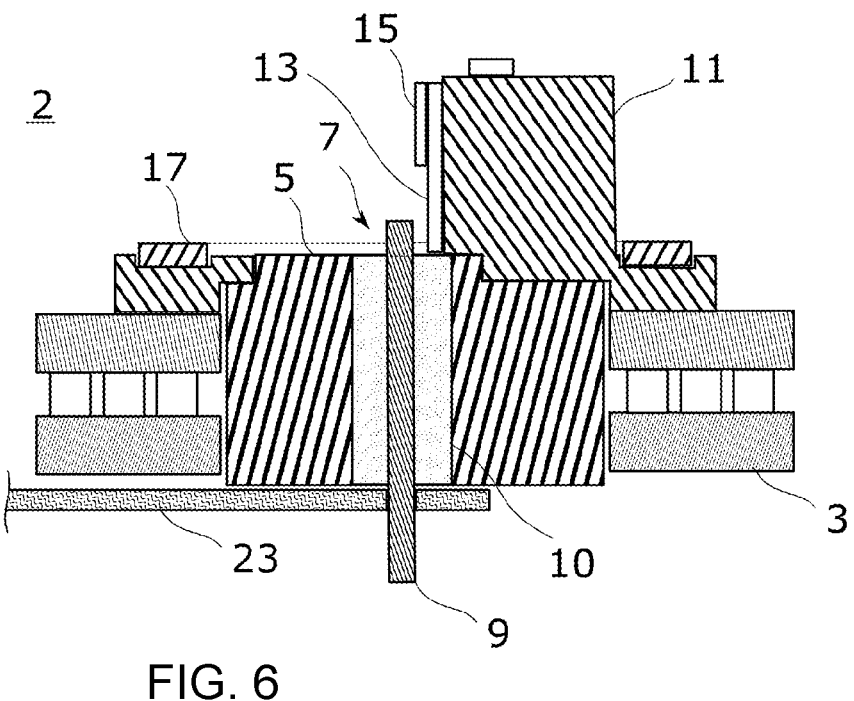
FIG. 6 is a sectional view of an assembly for an electronic component including a housing and a thermoelectric cooler 3 as well as a flex board, in accordance with an exemplary embodiment of the present invention.

FIG. 6 is a sectional view of an assembly for an electronic component including housing 1 and thermoelectric cooler 3 as well as, in this case, flex board 23. Here, base body 5 and, thus, opening 7 and pin (or pins) 9 have to be long compared to standard feedthroughs in order to protrude from opening 33 of cooler 3, as the height of cooler 3 in which socket 2 (or housing 1, respectively) is arranged, has to be compensated for. Long feedthroughs, that is, long base bodies 5, may be difficult to produce. However, such an embodiment may be optional in terms of performance. Further, such an embodiment may be optional if a rigid flex board 23 is to be used.

Figure 7:
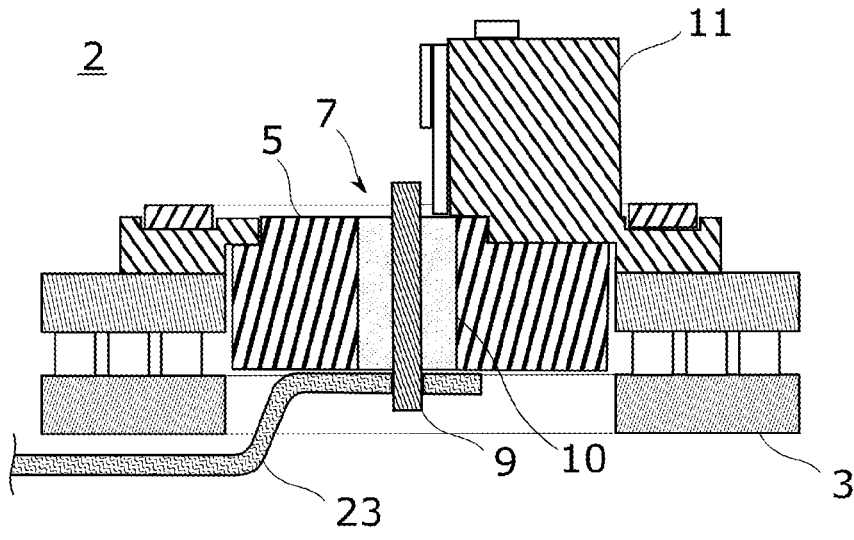
FIG. 7 is a sectional view an assembly with a flexible flex board, in accordance with an exemplary embodiment of the present invention.

However, if a long base body is too difficult to provide, this may be compensated for. For example, as is depicted in FIG. 7, a flexible flex board 23 may be used. This flexible flex board 23 may be bent so as to accommodate its end within opening 33 of cooler 3 at least partially. In the embodiment shown in FIG. 7, flex board 23 is guided along a bottom part of hot plate 32 and bent a first time along a portion of the side wall of opening 33 and a second time along the bottom side of base body 5 to be attached to the bottom side of base body 5 and, thus, to pin 9.

Figure 8:
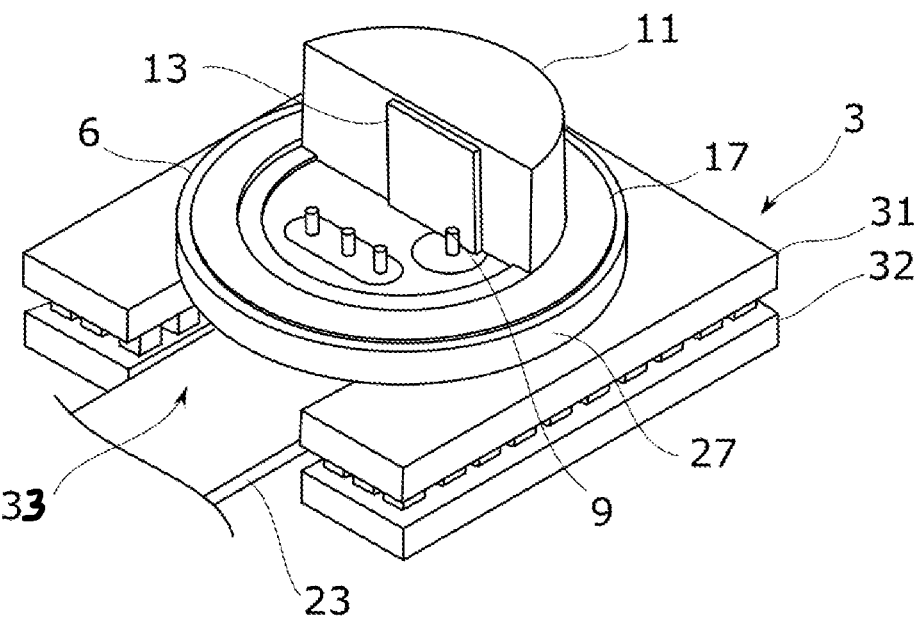
FIG. 8 is a perspective view of another embodiment of an assembly, in accordance with an exemplary embodiment of the present invention.
Figure 9:
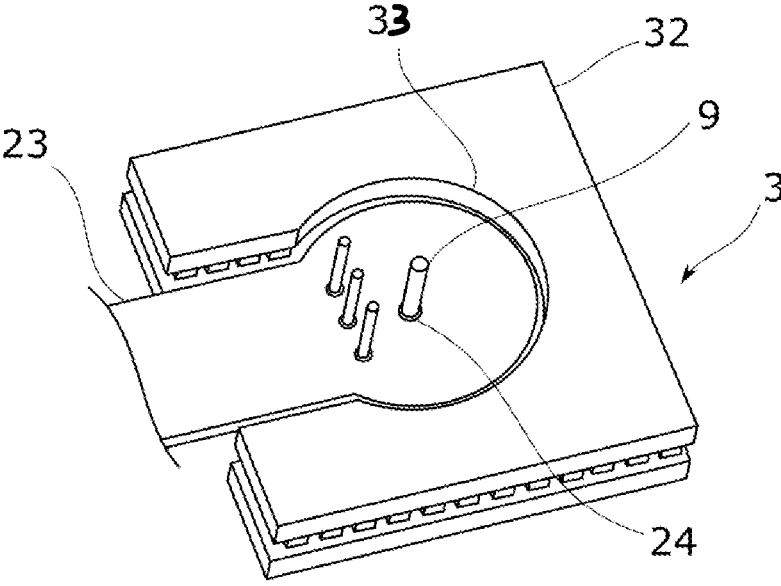
FIG. 9 is a perspective view of at least portions of the assembly of FIG. 8, in accordance with an exemplary embodiment of the present invention.

FIGS. 8 and 9 depict a further embodiment of an assembly of housing 1 and cooler 3. As shown in FIGS. 8 and 9, flex board 23 is arranged within opening 33 of cooler 3, wherein opening 33 includes a side cut-out so that flex board 23 may protrude to a side region of cooler 3. In this embodiment, the flex board 23 is guided from a side region of the thermoelectric cooler 3 through the side cut-out towards the pin 9 protruding from the bottom side of base body 5. As can be seen from FIGS. 8 and 9, opening 33 and socket 2 and/or housing 1 only have a partially similar shape, as opening 33 includes a round section and a cut out. For example, the shape of opening 33 may be in the form of a "horse shoe", or U-shaped, or in the form of a match, that is, a straight section followed by a round-shaped end portion. Socket 2 and/or housing 1 may still be circularly shaped so as to fit in the round-shaped (or partially circular) end portion. Here, flex board 23 has a shape that is, in a top view, similar to that of opening 33 and, as can be seen from FIG. 9, includes opening 24 for receiving pin 9.

Figure 10:
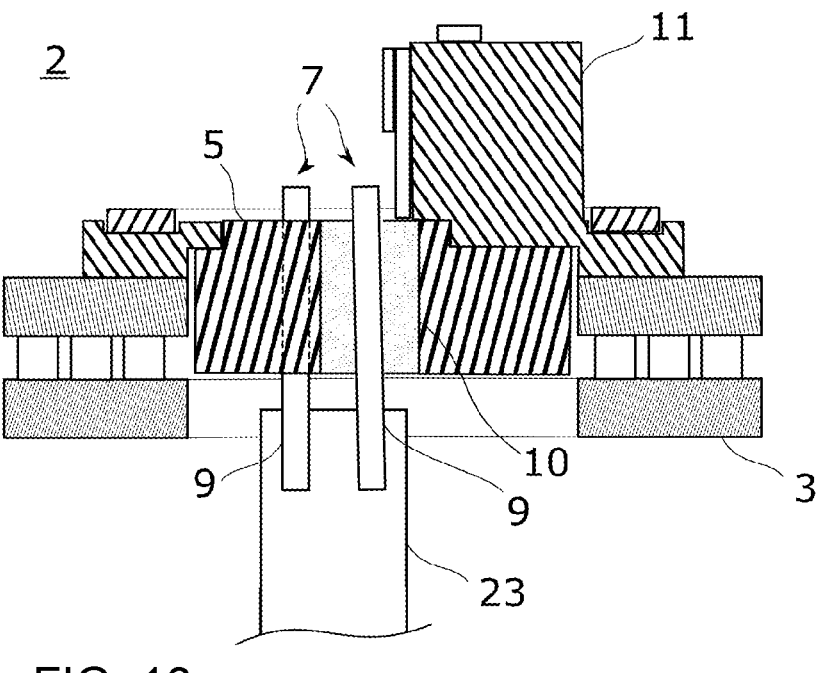
FIG. 10 is a sectional view of yet another embodiment of an assembly, in accordance with an exemplary embodiment of the present invention.

FIG. 10 depicts a further embodiment of the assembly. In the embodiment shown in FIG. 10, flex board 23 is attached to pin (or pins) 9 while being arranged within opening 33 at least partially, wherein flex board 23 is parallel to pin (or pins) 9. Specifically, in this configuration, the longitudinal direction of the pin 9 extends along the surface of the flex board 23. The end of the flex board optionally is located within the opening 33, or the flex board 23 protrudes from opening 33, respectively. Such an embodiment may be optional if a more rigid flex board 23 is to be used.

As will be understood from the disclosure, socket 2 and/or housing 1 as well as the assembly including housing 1 and thermoelectric cooler 3 according to embodiments of the disclosure offer several possibilities for minimizing RF losses. Improved RF properties may be achieved by providing a ring-shaped thermoelectric cooler 3, for example, while base body 5 is configured so that it protrudes from opening 33 within cooler 3. Further, improved RF properties may also be achieved by providing a cooler 3 with opening 33 in U-shape or "horse-shoe" shape. Furthermore, improved RF properties may also be achieved by bending flex board 23 as shown in FIG. 7.

This will now be further illustrated with reference to FIGS. 11 and 12.

Figure 11:
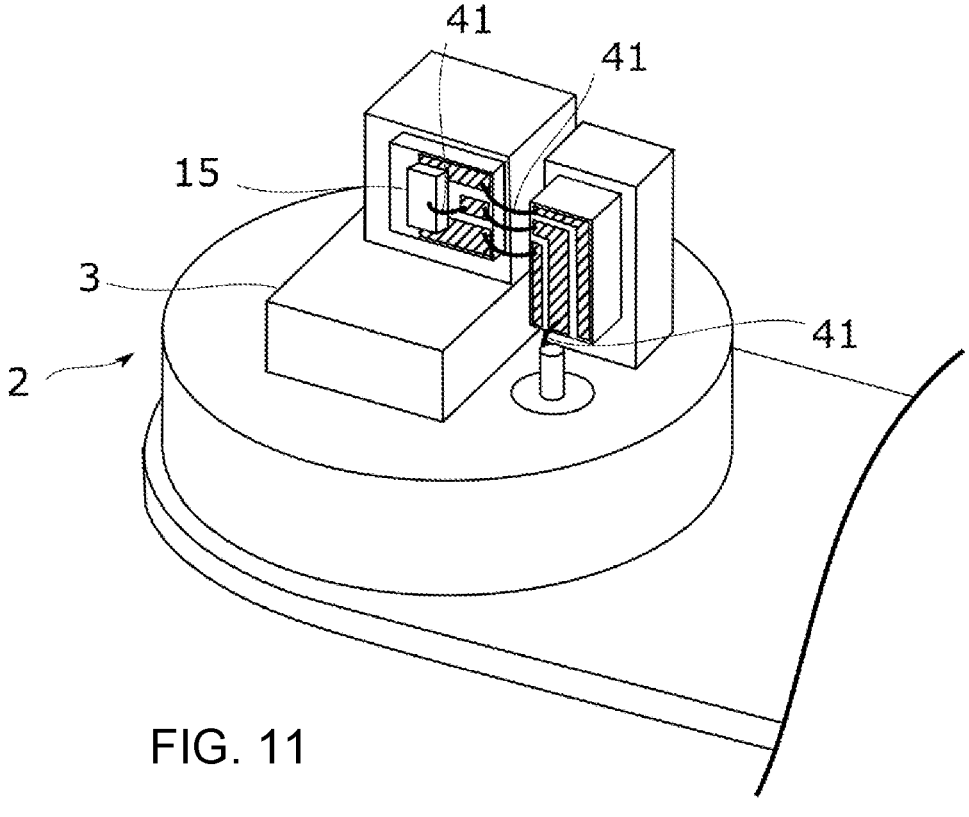
FIG. 11 is a schematic perspective view of a socket according to the state of the art.

FIG. 11 depicts schematically and not drawn to scale a socket 2 according to the state of the art. Socket 2 is formed integrally, that is, a socket that does not include a base body and a shell part. As a consequence, in order to provide for a suitable cooling of electronic component 15, thermoelectric cooler 3 has to be arranged within the housing, that is, on the inward side of socket 2. That is, cooler 3 is, here, an internal TEC. The height of this internal TEC 3 has to be provided for. Thus, a greater height of the housing results. Further, several bond wire connections 41 are necessary, that is, the RF pin is bonded to a substrate, in that case a CPW substrate (coplanar waveguide substrate) via a first bond wire 41, and further, this CPW substrate is bonded to submount 13 of the electronic component 15 via a second bond wire 41, with the electronic component 15 being furthermore connected to the submount 13 via a third bond wire 41.

Figure 12:
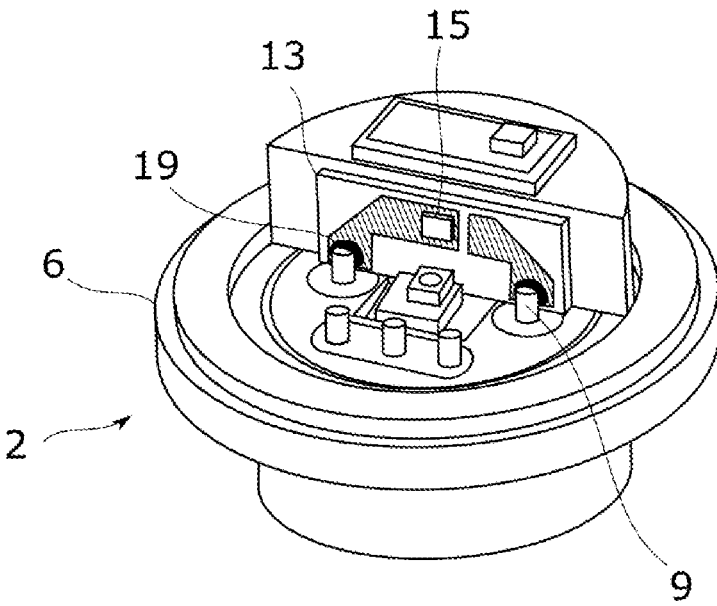
FIG. 12 is a perspective view of a socket, in accordance with an exemplary embodiment of the present invention.

In contrast, in the example—depicted schematically and not drawn to scale—of FIG. 12, as socket 2 is formed including shell part and base body, cooler 3 need not be arranged within housing 1 (not depicted). Therefore, the electronic submount can be soldered to the RF pin directly.

| Reference numerals | |
|---|---|
| 1 | Housing |
| 2 | Socket |
| 3 | Thermoelectric cooler |
| 5 | Base body of socket 2 |
| 6 | Shell part of socket 2 |
| 7 | Opening, feedthrough |
| 9 | Pin |
| 10 | Sealing material |
| 11 | Pedestal |

-continued

| Reference numerals | |
|---|---|
| 13 | Submount |
| 15 | Electronic component |
| 17 | Ring |
| 19 | Braze connection |
| 21 | Temperature sensor |
| 23 | Flex board |
| 24 | Opening in 23 for receiving pin 9 |
| 25 | Cap |
| 26, 27 | Flange |
| 29 | Window in cap 25 |
| 31 | Cold plate of 3 |
| 32 | Hot plate of 3 |
| 33 | Opening in 3 |
| 34 | Semiconductor pillars |
| 41 | Bond wire |

While this invention has been described with respect to at least one embodiment, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A socket for an electronic component, the socket comprising:
   an electrically insulating material;
   a base body including at least one opening configured for accommodating an electrically conductive pin configured for being electrically connected to the electronic component, the at least one opening being sealed with the electrically insulating material such that the electrically conductive pin is fed through the at least one opening while being electrically insulated from the base body, the base body including a perimeter; and
   a shell part including a pedestal configured for accommodating the electronic component, at least the shell part of the socket including a metal with a thermal conductivity of at least 100 W/mK, the shell part being distinct from the base body and being arranged at the perimeter of and thus radially outward of the base body at least partially.

2. The socket according to claim 1, wherein the thermal conductivity is more than 200 W/mk.

3. The socket according to claim 1, wherein the metal comprises at least one of Cu, Ag, Au, Mo, W, and Al, or any combination thereof.

4. The socket according to claim 1, further comprising the electronic component, wherein the electrically conductive pin is soldered to the electronic component directly.

5. The socket according to claim 1, wherein at least one of:
   (a) the shell part comprises the metal with a thermal conductivity of at least 200 W/mK; and
   (b) the pedestal and the base body both comprise the metal with a thermal conductivity of at least 100 W/mK.

6. The socket according to claim 5, wherein with respect to (a) the shell part is brazed to the base body, and with respect to (b) the pedestal and the base body both comprise the metal with the thermal conductivity being at more than 200 W/mK.

7. The socket according to claim 1, wherein the electrically insulating material comprises a glass or a glass ceramic.

8. The socket according to claim 1, wherein at least one of:

the socket has a circular shape;

the shell part of the socket comprises a ring configured for fixing a cap to the socket in a sealed manner;

the shell part laterally extends over the base body, thereby forming a flange;

the pedestal includes a side portion, and the socket further includes a central portion and a submount on which the electronic component is arranged, wherein the side portion faces towards the central portion of the socket, wherein at least one of the electronic component and the submount is/are arranged on the side portion of the pedestal; and the pedestal has a height of at least 1.0 mm and at most 3.0 mm.

9. The socket according to claim 8, wherein the sealed manner is a hermetically sealed manner which is configured for occurring by at least one of fusing, soldering, and brazing.

10. A housing for an electronic component, the housing comprising:

a socket for the electronic component, the socket comprising:

an electrically insulating material;

a base body including at least one opening configured for accommodating an electrically conductive pin configured for being electrically connected to the electronic component, the at least one opening being sealed with the electrically insulating material such that the electrically conductive pin is fed through the at least one opening while being electrically insulated from the base body, the base body including a perimeter; and a shell part including a pedestal configured for accommodating a submount, at least the shell part of the socket including a metal with a thermal conductivity of at least 100 W/mK, the shell part being distinct from the base body and being arranged at the perimeter of and thus radially outward of the base body at least partially; and a cap for sealing the electronic component.

11. The housing according to claim 10, wherein the housing is a transistor outline housing.

12. The housing according to claim 10, wherein the thermal conductivity is more than 200 W/mk.

13. The housing according to claim 10, wherein no thermoelectric cooler is arranged within the housing.

14. The housing according to claim 10, wherein the height of the housing is less than 6.0 mm.

15. An assembly for an electronic component, the assembly comprising:

a housing including a socket for the electronic component, the socket including:

an electrically insulating material;

a base body including at least one opening configured for accommodating an electrically conductive pin configured for being electrically connected to the electronic component, the at least one opening being sealed with the electrically insulating material such that the electrically conductive pin is fed through the at least one opening while being electrically insulated from the base body, the base body including a perimeter; and a shell part including a pedestal configured for accommodating the electronic component, at least the shell part of the socket including a metal with a thermal conductivity of at least 100 W/mK, the shell part being distinct from the base body and being arranged at the perimeter of and thus radially outward of the base body at least partially, the shell part further including a bottom region and a side region;

a thermoelectric cooler including a cold end side, the housing being attached to the thermoelectric cooler such that at least one of the bottom region and the side region of the shell part of the socket is attached to the cold end side of the thermoelectric cooler.

16. The assembly according to claim 15, wherein the thermoelectric cooler comprises an opening configured for accommodating the housing such that at least the base body of the socket is arranged within the opening at least partially.

17. The assembly according to claim 16, wherein the opening of the thermoelectric cooler has, in a top view, at least partially a shape similar to at least one of a shape of the housing and a shape of the socket.

18. The assembly according to claim 16, wherein the thermoelectric cooler includes a hot plate including a side region, a gap being formed at least between the side region of the hot plate of the thermoelectric cooler and the socket.

19. The assembly according to claim 16, wherein the base body includes a bottom side, the assembly further comprising a flex board arranged on the bottom side of the base body, wherein:

(a) the thermoelectric cooler includes a hot plate including a bottom part, wherein the opening includes a side wall, and wherein the flex board is guided along the bottom part of the hot plate and is bent a first time along a portion of the side wall of the opening and a second time along the bottom side of the base body to be attached to the bottom side of base body;

(b) the assembly further includes an electrically conductive pin, wherein the thermoelectric cooler includes a side region, and wherein the flex board is arranged within the opening of the thermoelectric cooler, wherein the opening comprises a side cut-out such that the flex board is guided from the side region of the thermoelectric cooler through the side cut-out towards the electrically conductive pin protruding from the bottom side of base body; or (c) the assembly further includes an electrically conductive pin, wherein the flex board is arranged within the opening at least partially, and wherein the flex board is arranged parallel to the electrically conductive pin such that the flex board protrudes from the opening.

* * * * *